United States Patent
Gans

[19]

[11] Patent Number: 6,161,204
[45] Date of Patent: Dec. 12, 2000

[54] METHOD AND APPARATUS FOR TESTING SRAM MEMORY CELLS

[75] Inventor: Dean Gans, Boise, Id.

[73] Assignee: Micron Technology, Inc., Boise, Id.

[21] Appl. No.: 09/024,826

[22] Filed: Feb. 17, 1998

[51] Int. Cl.$^7$ .................................................. G11C 29/00
[52] U.S. Cl. .......................................................... 714/718
[58] Field of Search .................................. 714/718, 724; 327/276, 263

[56] References Cited

U.S. PATENT DOCUMENTS

| | | | |
|---|---|---|---|
| 5,025,422 | 6/1991 | Moriwaki et al. | 365/233.5 |
| 5,119,158 | 6/1992 | Hatano | 257/203 |
| 5,325,367 | 6/1994 | Dekker et al. | 714/718 |
| 5,432,747 | 7/1995 | Fuller et al. | 365/203 |
| 5,450,362 | 9/1995 | Matsuzaki | 365/201 |
| 5,483,488 | 1/1996 | Sanada | 365/189.03 |
| 5,502,677 | 3/1996 | Takahashi | 365/201 |
| 5,745,432 | 4/1998 | McClure | 365/230.06 |
| 5,808,947 | 9/1998 | McClure | 365/201 |
| 5,841,709 | 11/1998 | McClure | 365/200 |
| 5,841,789 | 11/1998 | McClure | 714/724 |
| 5,930,185 | 7/1999 | Wendell | 365/201 |

*Primary Examiner*—Albert De Cady
*Assistant Examiner*—Guy Lamarre
*Attorney, Agent, or Firm*—Dorsey & Whitney LLP

[57] ABSTRACT

A write driver circuit includes a drive circuit having a first drive node adapted to receive a first voltage, a second drive node, an input adapted to receive a data signal, and an output. The drive circuit couples the output to the first voltage node when the data signal has a first logic voltage, and couples the output to the second drive node when the data signal has a second logic voltage. A test circuit has an input adapted to receive a test mode signal, and an output coupled to the second drive node. The test circuit develops a first impedance between the second drive node and a second voltage source when the test mode signal is active, and develops a second impedance between the second drive node and the second voltage source when the, test mode signal is inactive.

42 Claims, 8 Drawing Sheets

METHOD AND APPARATUS FOR TESTING SRAM MEMORY CELLS

TECHNICAL FIELD

The present invention relates generally to semiconductor memories, and more specifically to a method and circuit for testing memory cells in a synchronous static random access memory by modulating the rate of change of voltages developed on digit lines when writing data to the memory cells.

BACKGROUND OF THE INVENTION

During the manufacture of static random access memories ("SRAMs"), as well as other types of semiconductor memories, it is necessary to test the SRAM to ensure it is operating properly. An SRAM normally includes an array of memory cells arranged in rows and columns. The memory cells are tested by writing data to and reading data from the individual memory cells. Numerous test methodologies are utilized in testing for various types of defects that can occur in SRAM memory cells, such as shorted digit lines or inoperable access transistors. For example, a binary "1" or binary "0" may be written to and read from each SRAM memory cell, or alternating patterns of binary 1's and 0's may be written to and read from the memory cells in each row.

FIG. 1 illustrates a conventional SRAM memory cell 10 coupled between a pair of complementary digit lines DL and $\overline{DL}$. The SRAM memory cell 10 includes a conventional pair of cross-coupled inverters 12 and 14 comprising the transistors 16, 18 and 20, 22, respectively, coupled between a supply voltage source $V_{CC}$ and ground. As known in the art, each of the inverters 12 and 14 has an associated threshold voltage $V_T$ corresponding to the voltage a signal on its input must reach before the inverter begins driving its output to the complement of the input signal. A pair of access transistors 24 and 26 couple an output node 17 of the inverter 12 to the digit line $\overline{DL}$ and an output node 21 of the inverter 14 to the digit line DL, respectively, in response to a word line signal WL. A write driver circuit 28 receives complementary data signals D and $\overline{D}$ and develops voltages on the digit lines DL and $\overline{DL}$ corresponding to the complementary data signals D and $\overline{D}$, respectively.

The operation of the SRAM memory cell 10 during a typical write operation will now be described with reference to the signal timing diagram of FIG. 2. At the time $t_0$, the data signals D and $\overline{D}$ go high and low, respectively, corresponding to the data to be stored in the memory cell 10. In response to the data signals D and $\overline{D}$, the write driver circuit 28 drives the voltages on the digit lines DL and $\overline{DL}$ high and low, respectively. The write driver circuit 28 cannot instantaneously drive the voltages on the digit lines DL and $\overline{DL}$ to their desired levels, however, because the digit lines DL and $\overline{DL}$ are highly capacitive. The capacitances of the digit lines DL and $\overline{DL}$ cause the voltages on the digit lines to gradually approach their desired levels. The word line WL is activated just after the time $t_0$ thereby coupling the nodes 17 and 21 to the digit lines $\overline{DL}$ and DL, respectively. At a time $t_1$, the voltages on the digit lines DL and $\overline{DL}$ reach the threshold voltages $V_T$ of the inverters 12 and 14, and the inverters begin driving the voltages on nodes 17 and 21 low and high, respectively. In other words, the inverter 12 begins driving the voltage on node 17 low in response to the high on the digit line DL. The voltage on node 17 is also driven low by the low going voltage on the digit line $\overline{DL}$. The inverter 14 operates in the same way to drive the voltage on node 21 high. In this way, the SRAM memory cell 10 drives the nodes 17 and 21 low and high, respectively, corresponding to the voltages developed on the digit lines $\overline{DL}$ and DL. At a time $t_2$, the word line WL is deactivated turning OFF the access transistors 24 and 26 and isolating the nodes 17 and 21 from the digit lines $\overline{DL}$ and DL, respectively. The memory cell 10 maintains the voltages on the nodes 17 and 21 low and high, respectively, after the word line WL is deactivated and in this way stores the data written to the memory cell.

The threshold voltages $V_T$ of the inverters 12 and 14 determine when the inverters 12 and 14 begin turning ON and thereby determine when the memory cell 10 begins latching the data placed on the digit lines DL and $\overline{DL}$. The voltages on the digit lines DL and $\overline{DL}$ must exceed the threshold voltages $V_T$ of the inverters 12 and 14 before the time $t_2$, which is when the data signals D and $\overline{D}$ change state and when the access transistors 24 and 26 are deactivated. The interval between the times $t_0$ and $t_2$ is the write pulse width $t_{WPW}$ of the data signals on the digit lines DL and $\overline{DL}$.

During the testing of SRAMs, it is desirable to perform margin tests on the SRAM memory cells in which the margins of the data signals developed on digit lines DL and $\overline{DL}$ are varied. In a timing margin test, the write pulse width $t_{WPW}$ is made shorter than its normal duration. When the write pulse width $t_{WPW}$ is shortened, the data signals on the digit lines DL and $\overline{DL}$ may not exceed the threshold voltages $V_T$ of the inverters 12 and 14 during the write pulse width and the memory cell 10 may not latch the data placed on the digit lines DL and $\overline{DL}$. During normal operation of an SRAM slight variations in write pulse width $t_{WPW}$ may occur, and this type of margin test detects cells that may fail due to such slight variations. In asynchronous SRAMs, the duration of the write pulse width $t_{WPW}$ is controlled by external asynchronous control signals applied to the SRAM. Thus, the write pulse width $t_{WPW}$ can be easily adjusted by varying such external control signals. The write pulse width $t_{WPW}$ is shortened when writing data to the memory cells and then the data read from the memory cells to determine whether the memory cells properly stored the written data. In synchronous SRAMs, however, as well as other types of SRAMs, the write pulse width $t_{WPW}$ is constant and determined by a fixed internal signal that is not externally adjustable. Thus, in synchronous SRAMs, the write pulse width cannot be easily shortened to perform margin tests on the memory cells.

There is a need for performing margin tests of memory cells in synchronous SRAMs.

SUMMARY OF THE INVENTION

A write driver circuit includes a drive circuit having a first drive node adapted to receive a first voltage, a second drive node, an input adapted to receive a data signal, and an output. The drive circuit couples the output to the first drive node when the data signal has a first logic voltage, and couples the output to the second drive node when the data signal has a second logic voltage. A test circuit has an input adapted to receive a test mode signal, and an output coupled to the second drive node. The test circuit develops a first impedance between the second drive node and a second voltage source when the test mode signal is active, and develops a second impedance between the second drive node and the second voltage source when the test mode signal is inactive.

DETAILED DESCRIPTION OF THE INVENTION

Figure 3:
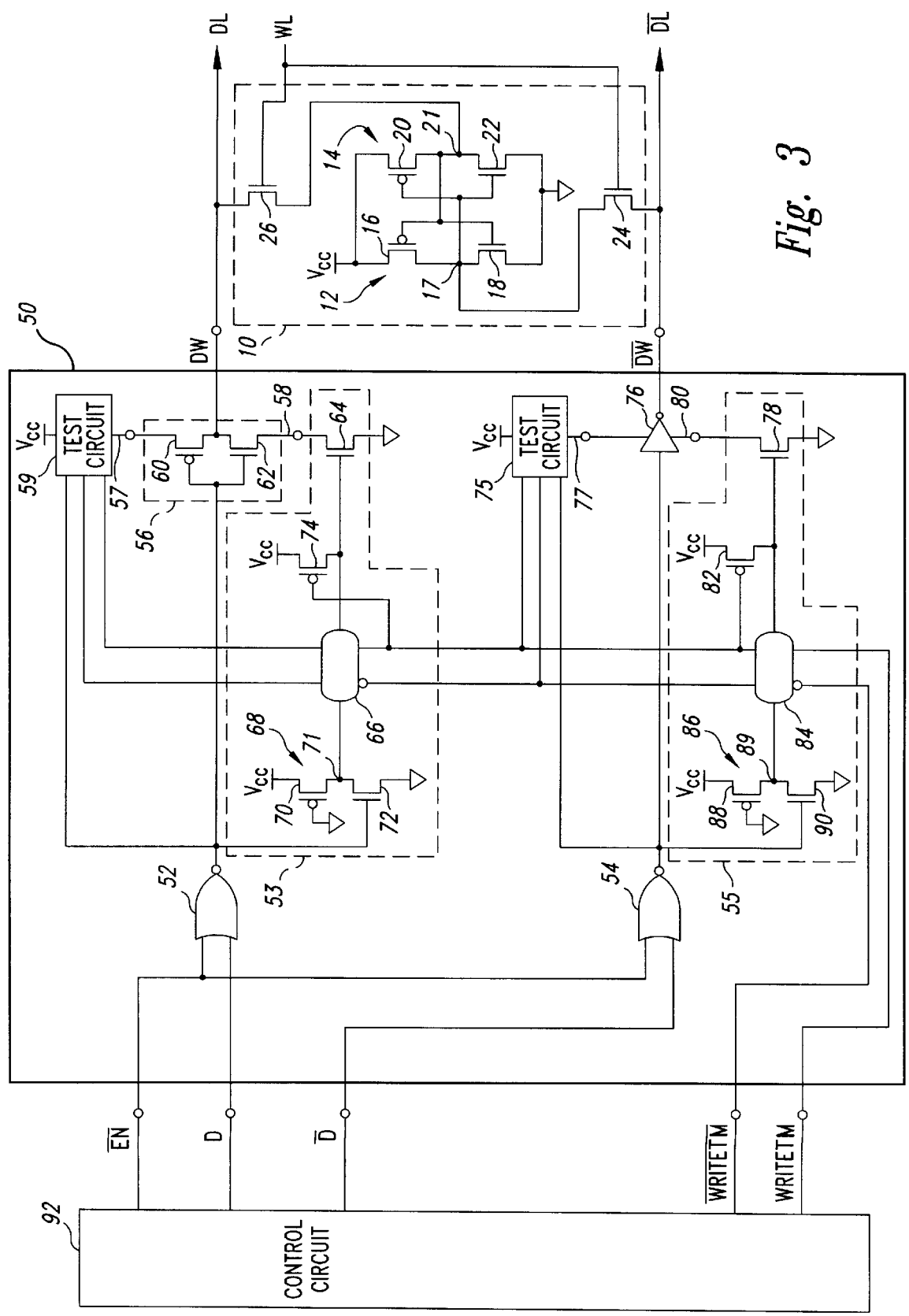
FIG. 3 is a schematic of a test mode write driver circuit according to one embodiment of the present invention.

FIG. 3 is a schematic diagram of a test mode write driver circuit 50 according to one embodiment of the present invention. The test mode write driver circuit 50 develops complementary signals on a pair of data write terminals DW and $\overline{\text{DW}}$ in response an enable signal $\overline{\text{EN}}$, a pair of data signals D and $\overline{\text{D}}$, and a pair of test mode signals WRITETM and $\overline{\text{WRITETM}}$. The voltage levels of the signals developed on the data write terminals DW and $\overline{\text{DW}}$ depends upon whether the write driver circuit 50 is operating in a normal write mode or a test write mode as will be explained in more detail below. The write driver circuit 50 includes a NOR gate 52 receiving a data signal D and an enable signal $\overline{\text{EN}}$. When the enable signal $\overline{\text{EN}}$ is low, the NOR gate 52 is enabled and drives its output to the complement of the data signal D. The output of the NOR gate 52 is coupled to an input of a buffer circuit 56 including a PMOS transistor 60 and an NMOS transistor 62 coupled in series between a high-write terminal 57 and a low-write terminal 58. When the output of the NOR gate 52 is low, the PMOS transistor 60 turns ON coupling a data write terminal DW to the high-write terminals supply voltage $V_{CC}$. If the output of the NOR gate 52 is high, the NMOS transistor 62 turns ON coupling the data write terminal DW to the low-write terminal 58. Thus, when the output of the NOR gate 52 is high, the voltage on the data write terminal DW is approximately equal to the voltage present on the low-write terminal 58.

A test circuit 53 presents a variable resistance between ground and the low-write terminal 58 in response to the output of the NOR gate 52 and the complementary test mode signals WRITETM and $\overline{\text{WRITETM}}$. When the test mode signals WRITETM and $\overline{\text{WRITETM}}$ are inactive, the test circuit 53 presents a small resistance between ground and the terminal 58. If the signals WRITETM and $\overline{\text{WRITETM}}$ are active, the test circuit 53 presents a larger resistance between ground and the terminal 58. A more detailed description of the operation and structure of the test circuit 53 is given below.

The test circuit 53 includes an NMOS transistor 64 which develops a variable resistance between the low-write terminal 58 and ground in response to a reference voltage applied to its gate. The gate of the NMOS transistor 64 is coupled through a transmission gate 66 to an output node 71 of a voltage reference circuit 68. The transmission gate 66 receives the complementary write test mode signals WRITETM and $\overline{\text{WRITETM}}$ and couples its input to its output when these signals are active high and low, respectively. The voltage reference circuit 68 develops first and second reference voltages on the node 71 in response to the state of the output of the NOR gate 52. The voltage reference circuit 68 includes a PMOS transistor 70 operating as a load and an NMOS transistor 72 presenting a variable resistance between the node 71 and ground in response to the output of the NOR gate 52. The value of the resistance of the NMOS transistor 72 determines which reference voltage is developed on the node 71. When the output of the NOR gate 52 is low, the NMOS transistor 72 presents a very large resistance and the first reference voltage approximately equal to the supply voltage $V_{CC}$ is developed on the node 71. When the output of the NOR gate 52 is high, the NMOS transistor 72 presents a smaller resistance and the second reference voltage having a predetermined value is developed on the node 71. By controlling the transistor 72 in response to the output of the NOR gate 52, substantially no current is drawn by the voltage reference circuit 68 when the output is low. Thus, when the enable signal $\overline{\text{EN}}$ goes high, which corresponds to an inactive state of the write driver circuit 50 as will be explained in more detail below, the NOR gate 52 drives its output low turning OFF the transistor 72 and reducing the overall power consumption of the write driver circuit 50. A PMOS transistor 74 drives the gate of the NMOS transistor 64 to approximately the supply voltage $V_{CC}$ when the write test mode signal WRITETM is low.

The test mode write driver circuit 50 may also include a test circuit 59 that develops a variable resistance between a supply voltage $V_{CC}$ and the high-write terminal 57 in response to the output of the NOR gate 52 and the test mode signals WRITETM and $\overline{\text{WRITETM}}$. The test circuit 59 may include circuitry similar to the test circuit 53, although one skilled in the art will realize other circuitry may also be utilized.

The test mode write driver circuit 50 further includes a NOR gate 54 receiving the enable signal $\overline{\text{EN}}$ and a complementary data signal $\overline{\text{D}}$, and having an output coupled to the input of a buffer circuit 76 which drives a complementary data write terminal $\overline{\text{DW}}$. A test circuit 55 includes an NMOS transistor 78 coupled between a reference terminal 80 of the buffer circuit 76 and ground, and has a gate coupled through a transmission gate 84 to an output node 89 of a voltage reference circuit 86 including a PMOS transistor 88 and NMOS transistor 90. The transmission gate 84 receives the signals WRITETM and $\overline{\text{WRITETM}}$, and a PMOS transistor 82 coupled between the gate of the transistor 78 and the supply voltage source $V_{CC}$ receives the signal WRITETM. A test circuit 75 identical to the test circuit 59 may also be coupled between the supply voltage $V_{CC}$ and a high-write terminal 77 of the buffer circuit 76. All of these components operate identically to the corresponding components previously described with reference to test circuits 53 and 59, and for the sake of brevity will not be described in further detail.

Figure 1:
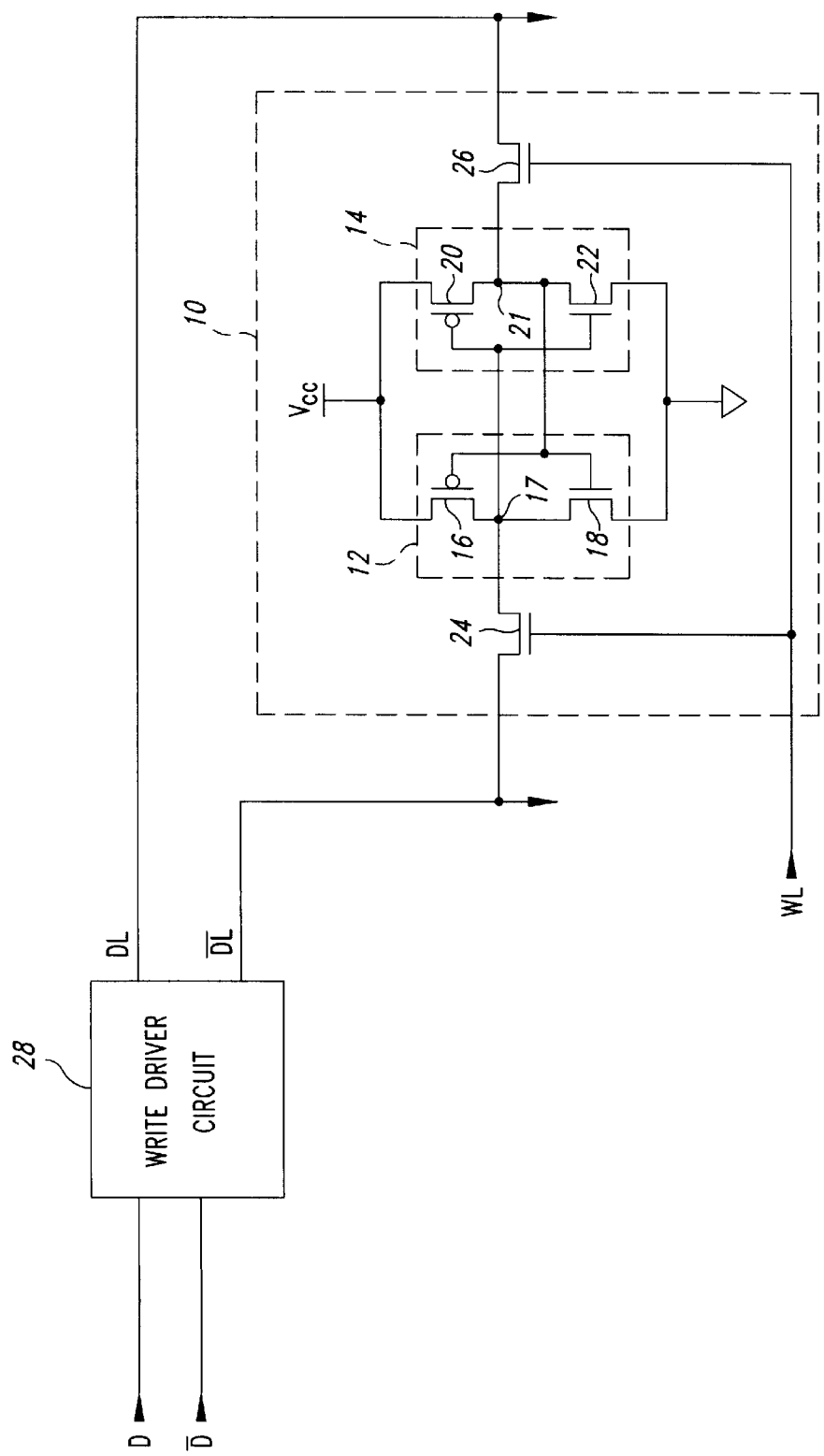
FIG. 1 is a schematic block diagram of a conventional SRAM memory cell and write driver circuit.
Figure 2:
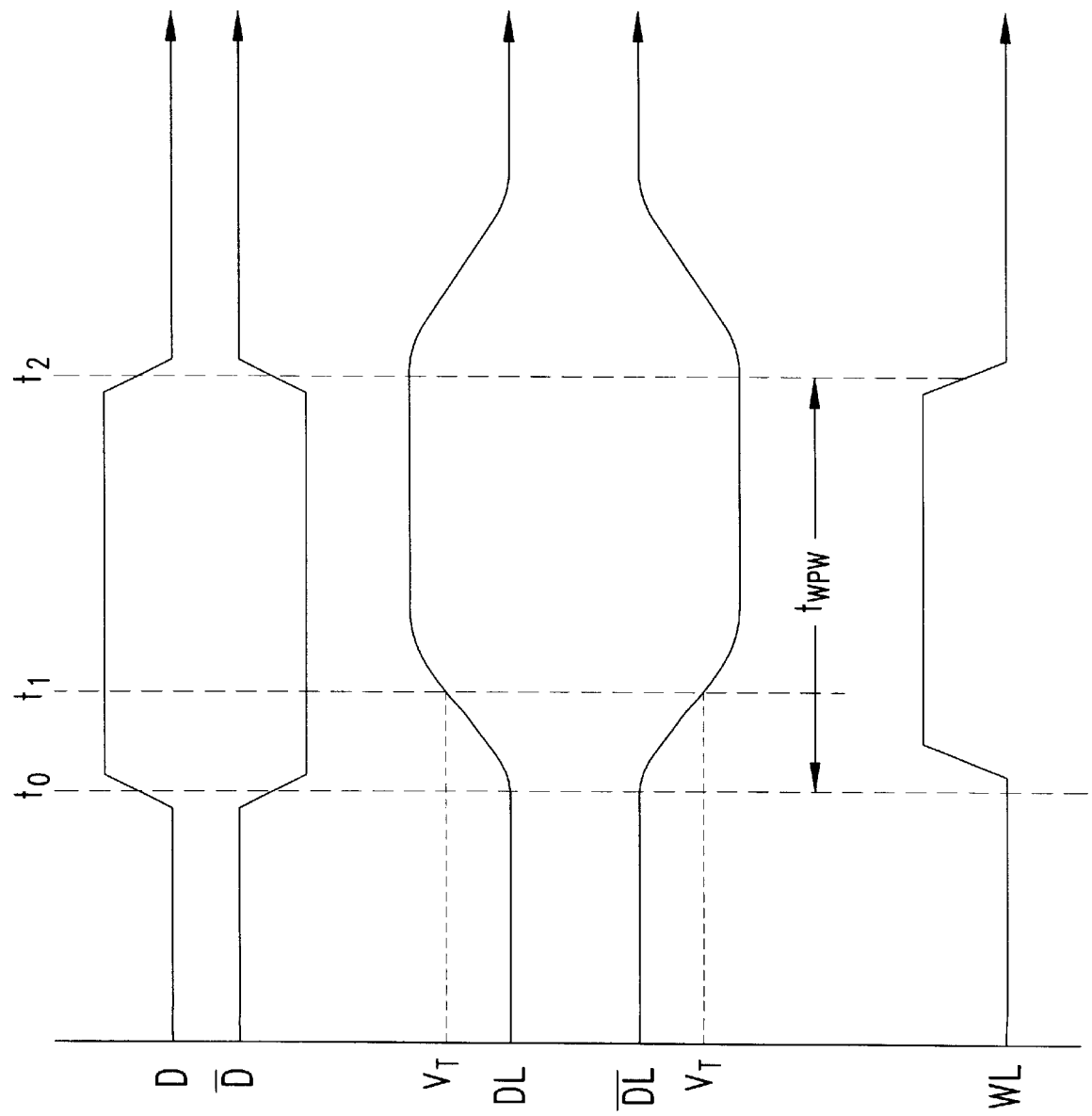
FIG. 2 is a signal timing diagram of various signals during operation of the SRAM memory cell and write driver circuit of FIG. 1.

In FIG. 3, the data write terminals DW and $\overline{\text{DW}}$ of the test mode write driver circuit 50 are coupled directly to complementary digit lines DL and $\overline{\text{DL}}$, respectively, and a conventional SRAM memory cell 10 is coupled between these complementary digit lines. The memory cell 10 is identical to that previously described with reference to FIG. 1 and will not be described in further detail. In addition, although the write driver circuit 50 is shown coupled directly to the complementary digit lines DL and $\overline{\text{DL}}$, one skilled in the art will realize that typically the data write terminals DW and $\overline{\text{DW}}$ are coupled to corresponding I/O lines which are, in turn, selectively coupled through input/output transistors to the complementary digit lines DL and $\overline{\text{DL}}$ associated with a particular column of memory cells in a memory-cell array.

In operation, the test mode write driver circuit 50 operates in two modes, a normal write mode and a test write mode. A control circuit 92 provides the signals $\overline{EN}$, D, $\overline{D}$, WRITETM, and $\overline{WRITETM}$ to control the test mode write driver circuit 50 during these modes of operation. In the following description of the operation of the write driver circuit 50, the high-write terminals 57 and 77 are assumed to be coupled directly to the supply voltage source $V_{CC}$ and no discussion of the test circuits 59 and 75 is provided. Such a description is being omitted for the sake of brevity and ease of explanation because, as previously described, the test circuits 59 and 75 operate in the same way as the test circuits 53 and 55. Thus, one skilled in the art will understand the operation of the write driver circuit 50 including the test circuits 59 and 75 based upon the description of the test circuits 53 and 55 set forth below.

Figure 4:
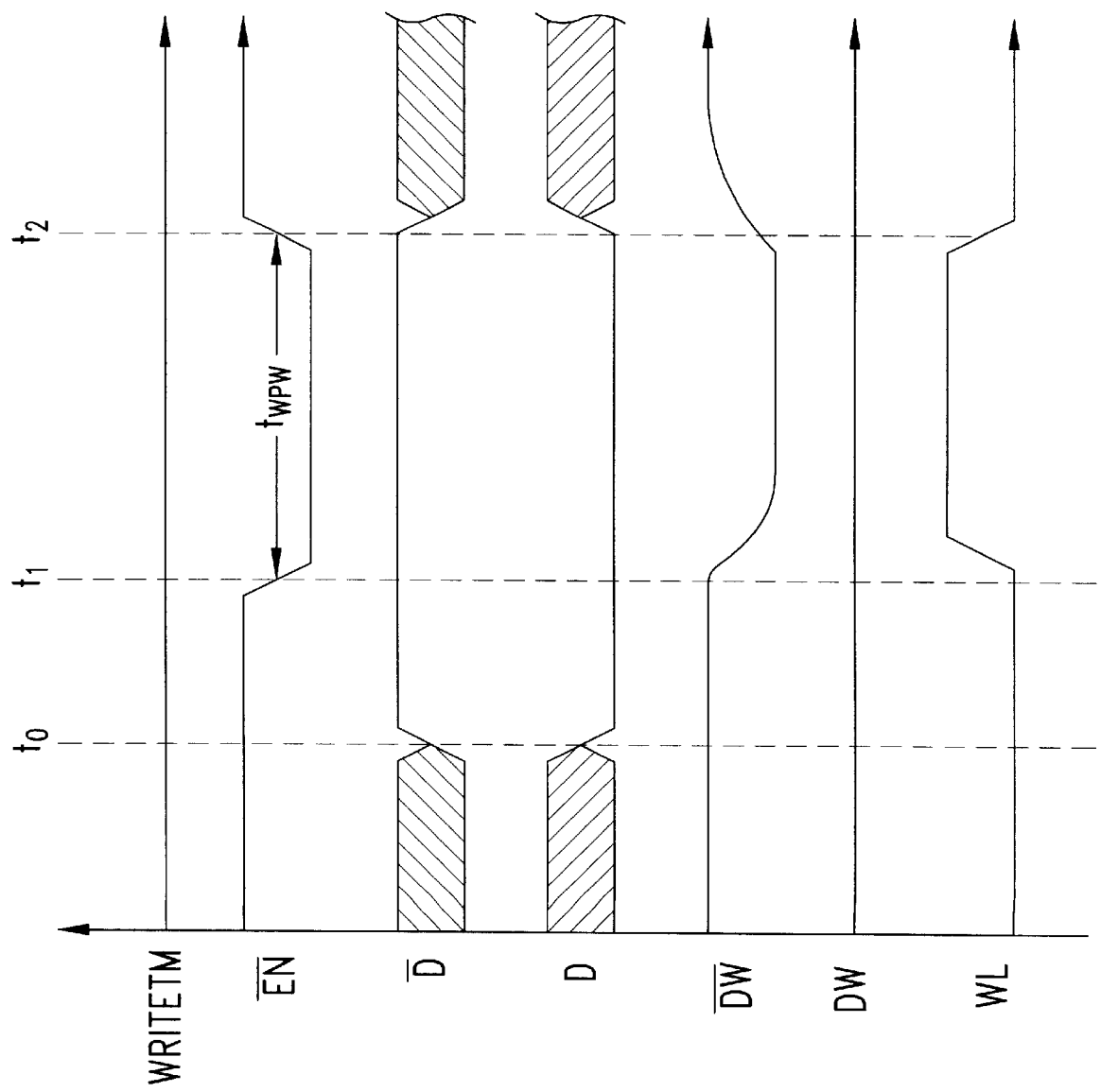
FIG. 4 is a signal timing diagram illustrating various signals in the write driver circuit of FIG. 3 during a write mode of operation.

FIG. 4 is a signal timing diagram illustrating operation of the write driver circuit 50 during the normal write mode of operation. The normal write mode is characterized by the control circuit 92 driving the test mode signals WRITETM and $\overline{WRITETM}$ inactive low and high, respectively. Before a time $t_0$ the write driver circuit 50 is inactive corresponding to a time when no data is to be written the memory cell 10. When the writer driver 50 is inactive, the control circuit 92 drives the enable signal $\overline{EN}$ high causing the NOR gates 52 and 54 to drive their outputs low and the buffer circuits 56 and 76, in turn, to drive the voltages on the data write terminals DW and $\overline{DW}$ high. As previously discussed, the data write terminals DW and $\overline{DW}$ are shown coupled to the digit lines DL and $\overline{DL}$ merely for ease of explanation and would typically be isolated from the digit lines when the enable signal $\overline{EN}$ is high so that the digit lines can be equilibrated and data read from the memory cells 10. In FIG. 4, only the signal WRITETM is shown but one skilled in the art will understand the signal $\overline{WRITETM}$ is merely the complement of this signal.

At the time $t_0$, the control circuit 92 drives the data signals D and $\overline{D}$ high and low, respectively, corresponding to the data to be written to the memory cell 10. During the normal write mode of operation, the data signals D and $\overline{D}$ provided by the control circuit 92 correspond to data placed on a data bus of a synchronous SRAM containing the write driver circuit 50. In response to the low signal WRITETM, the PMOS transistors 74 and 82 turn ON, coupling the gates of the NMOS transistors 64 and 78, respectively, to the supply voltage $V_{CC}$, and the transmission gates 66 and 84 turn OFF. In response to the supply voltage $V_{CC}$ on their gates, both transistors 64 and 78 present small resistances between the respective reference terminals 58 and 80 and ground. When the transistors 64 and 78 present small resistances, the buffer circuits 56 and 76 operate as conventional inverters to drive the voltages on the data write terminals DW and $\overline{DW}$ to the inverse of the voltages applied on their inputs as will be explained in more detail below.

At a time $t_1$, the control circuit 92 drives the enable signal $\overline{EN}$ low causing the NOR gate 54 to drive its output high and the buffer circuit 76, in turn, to drive the voltage on the terminal $\overline{DW}$ low. The voltage on the data write terminal $\overline{DW}$ gradually goes low due primarily to the capacitance of the digit line $\overline{DL}$ coupled to the terminal $\overline{DW}$. The word line WL is activated just after the time $t_1$ and the memory cell 10 begins driving the nodes 17 and 21 low and high, respectively. It should be noted that when the output of the NOR gate 54 goes high, the transistor 90 turns ON but the reference voltage on node 89 is isolated from the gate of the transistor 78 by the transmission gate 84 and thus does not affect operation of the buffer circuit 76. At a time $t_2$, the control circuit 92 drives the enable signal $\overline{EN}$ high and the word line WL low terminating the write operation. The write pulse width $t_{WPW}$ is defined by the interval from time $t_1$ to $t_2$ corresponding to the duration the enable signal $\overline{EN}$ is active.

Figure 5:
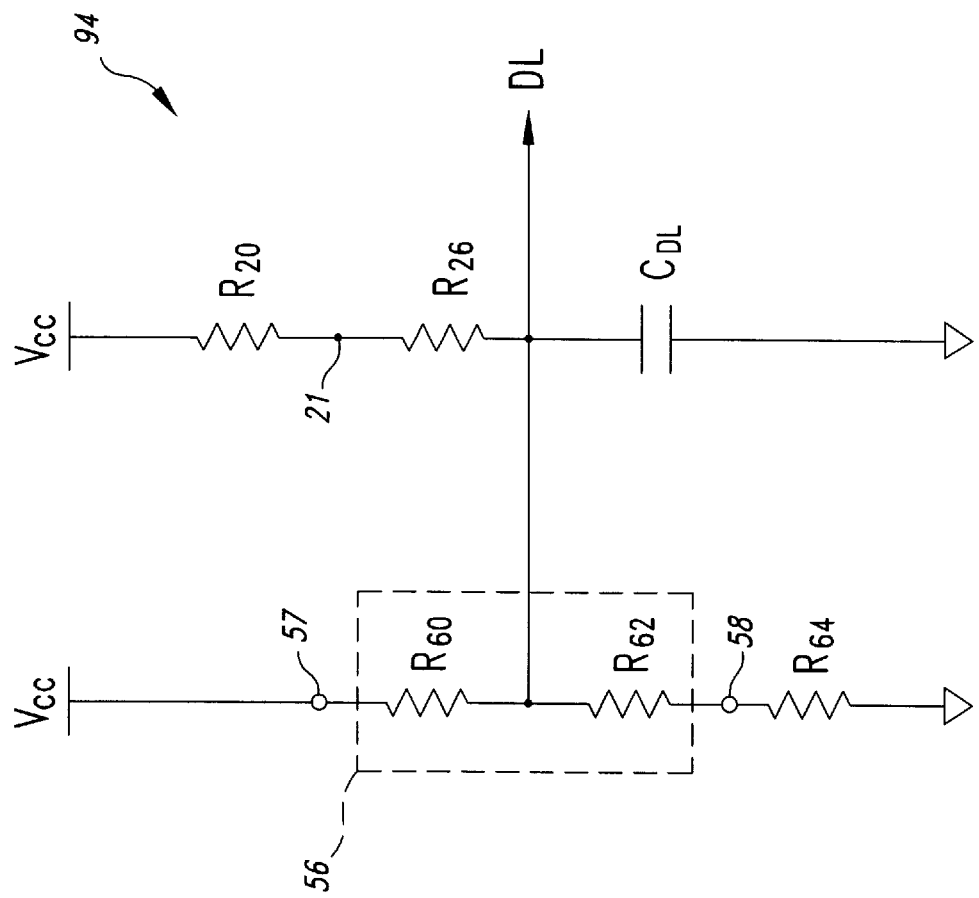
FIG. 5 illustrates equivalent circuit 94 of the buffer circuit 56 and portions of memory cell 10.

The operation of the buffer circuits 56 and 76 during the normal write mode will now be described in more detail with reference to the schematic of FIG. 5 illustrating the equivalent circuit 94 of the buffer circuit 56 and portions of the memory cell 10. Each of the resistances in FIG. 5 corresponds to an associated component in FIG. 3 having the same reference numeral. For example, the resistor $R_{62}$ corresponds to the resistance presented by the NMOS transistor 62, and the capacitor $C_{DL}$ corresponds to the capacitance of the digit line DL. Initially, assume the values of the resistors $R_{20}$ and $R_{26}$ are very small and the input of the buffer circuit 56 is low causing the resistor $R_{62}$ to have a very large value and the resistor $R_{60}$ to have a very small value. At this point, the write driver circuit 50 drives the voltage on the digit line DL to approximately the supply voltage $V_{CC}$ since the voltage drop across the resistor $R_{60}$ is very small. The voltage on the digit line DL is also driven to the supply voltage $V_{CC}$ through the resistors $R_{20}$ and $R_{26}$ in the memory cell 10. When the input of the buffer circuit 56 goes high, the value of the resistor $R_{60}$ becomes very large and the value of the resistor $R_{62}$ becomes very small. At this point, the capacitor $C_{DL}$ is discharged through the resistors $R_{62}$ and $R_{64}$ to ground, thereby driving the voltage on the digit line DL to approximately zero volts. Since the resistors $R_{62}$ and $R_{64}$ both have very small values, the voltage on the digit line DL decays rather quickly to approximately equal to zero volts.

The operation of the write driver circuit 50 during the test write mode will now be described with reference to the signal timing diagram of FIG. 6. Before a time $t_0$, the control circuit 92 drives the enable signal $\overline{EN}$ high, and drives the test mode signals WRITETM and $\overline{WRITETM}$ inactive low and high, respectively. At the time $t_0$, the control circuit 92 activates the test mode signals WRITETM and $\overline{WRITETM}$ driving them high and low, respectively, and placing the driver circuit 50 in the test mode of operation. In response to the active signals WRITETM and $\overline{WRITETM}$, the transmission gates 66 and 84 turn ON and the PMOS transistors 74 and 82 turn OFF. At a time $t_1$, the control circuit 92 drives the data signals D and $\overline{D}$ low and high, respectively, corresponding to the test data to be written to the memory cell 10. During the test write mode of operation, the data signals D and $\overline{D}$ may correspond either to test data placed on the data bus of the synchronous SRAM by an external circuit, or to test data generated by the control circuit 92 for testing the SRAM memory cells 10. The control circuit 92 thereafter drives the enable signal $\overline{EN}$ low at a time $t_2$, enabling the NOR gates 52 and 54, and drives the word line signal WL high coupling the memory cell 10 to the digit lines DL and $\overline{DL}$. When the enable signal $\overline{EN}$ goes low, the NOR gate 54 continues driving its output low due to the high signal $\overline{D}$ on its input, and the buffer circuit 76, in turn, maintains the signal on the data write terminal $\overline{DW}$ high. In addition, note that the voltage reference circuit 86 develops the first reference voltage of approximately $V_{CC}$ on the node 89 in response to the low output of the NOR gate 54. The first reference voltage on node 89 is applied to the gate of the transistor 78 through the activated transmission gate 84, causing the transistor 78 to present a small resistance between the terminal 80 and ground. The state of the transistor 78 does not, however, affect operation of the buffer circuit 76 when the output of the NOR gate 54 is low because the data write terminal $\overline{DW}$ is isolated from the terminal 80.

Also at the time $t_2$, the NOR gate 52, which now has two low inputs, drives its output high. In response to the high output from the NOR gate 52, the NMOS transistor 62 turns ON coupling the data write terminal DW to the low-write terminal 58. The NMOS transistor 72 also turns ON in response to the high output from the NOR gate 52 causing the voltage reference circuit 68 to develop the second reference voltage on the node 71 which is coupled through the transmission gate 26 to the gate of the NMOS transistor 64. In response to the second reference voltage, the NMOS transistor 64 presents a resistance $R_{TEST}$ that is larger than the resistance the transistor 64 presents during the normal write mode. Referring back to FIG. 5, the capacitor $C_{DL}$ is now discharged through the resistor $R_{62}$ and the resistor $R_{TEST}$, which corresponds to the resistor $R_{64}$. The voltage on the digit line DL decays more slowly in this mode due to the increased resistance $R_{TEST}$. This is seen in FIG. 6 by comparing the solid line indicating the voltage on the digit line DL during the test write mode and the dotted line indicating such voltage during the normal write mode as previously described with reference to FIG. 4. At a time $t_3$, the control circuit 92 deactivates the enable signal $\overline{EN}$ and the word line WL terminating the test data write operation. The time interval $t_2$–$t_3$ defines the write pulse width time $t_{WPW}$ which, as previously discussed, is constant and not easily adjusted in a synchronous SRAM. In the example of FIG. 6, the voltage on the digit line DL reaches the threshold voltages $V_T$ of the inverters 12 and 14 in the memory cell 10 before the time $t_3$ so the memory cell 10 latches the test data. If the voltage on the digit line DL did not reach the threshold voltage $V_T$ before the time $t_3$, the memory cell 10 would not store the test data and would fail the margin test.

FIG. 5 also illustrates operation of the test mode write driver circuit 50 during the test write mode of operation when the transistor 78 presents the test resistance $R_{TEST}$. At the time $t_4$, the control circuit 92 drives the data signals D and $\overline{D}$ high and low, respectively, and at a time $t_5$ the control circuit 92 drives the enable signal $\overline{EN}$ low causing the write driver circuit 50 to drive the voltage digit line DL high and to discharge the capacitance $C_{DL}$ of the digit line $\overline{DL}$ causing the voltage on that line to decay as shown. Once again, the voltage on the digit line $\overline{DL}$ has the write pulse width time $t_{WPW}$ until a time $t_6$ to reach the threshold voltages $V_T$ of the inverters 12 and 14 in the memory cell 10.

The write drive circuit 50 performs a voltage margin test on the SRAM memory cell 10 by adjusting the rate at which the voltage goes low on one of the digit lines DL and $\overline{DL}$ during a write operation. In this voltage margin test, the rate at which the voltage goes low is varied while the write pulse width $t_{WPW}$ is kept constant. Although this is the converse of the previously described timing margin test, one skilled in the art will realize the same type of functional testing is achieved with this voltage margin test. This is true because the voltage on one of the digit lines DL and $\overline{DL}$ takes longer to reach the threshold voltage $V_T$ of the associated inverter 12 or 14 in the memory cell 10. Thus, the voltage margin test detects memory cells 10 that may fail upon the occurrence of slight variations in the voltages or write pulse widths $t_{WPW}$ of data signals on the digit lines DL and $\overline{DL}$ during normal write operations.

In the test mode write driver circuit 50, the rate at which the voltage on one of the digit lines DL and $\overline{DL}$ goes low during the test write mode may be adjusted by varying the reference voltages developed by the reference voltage circuits 68 and 86 as well as varying the characteristics of the transistors 64 and 78. In addition, the test circuits 53, 55, 59, and 75 of the circuit 50 may be easily modified to perform a similar margin test by coupling test voltages directly to the high-write terminals 57, 77 and low-write terminals 58, 80. In one such embodiment, the test circuits 53 and 55 develop a test voltage on the terminals 58, 80 having a value greater than the zero volts of a normal low signal, and the test circuits 59, 75 develop a test voltage on the terminals 57, 77 having a value less than the supply voltage $V_{CC}$ of a normal high signal.

Figure 6:
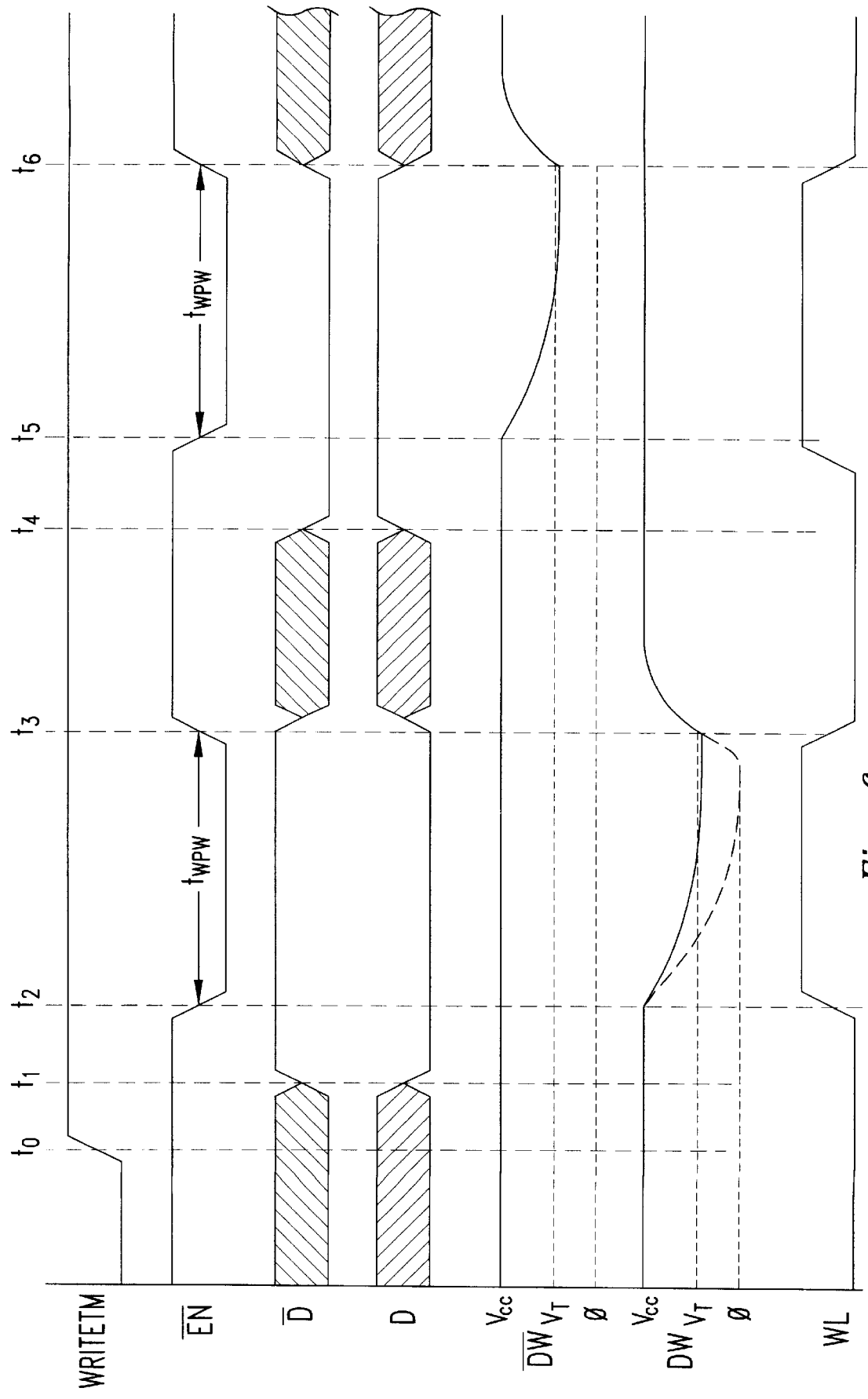
FIG. 6 is a signal timing diagram illustrating various signals in the write driver circuit of FIG. 3 during a test mode of operation.

FIG. 6 is a functional block diagram of a synchronous SRAM 100 including a number of the write driver circuits 50 of FIG. 3, one of which is shown. In the synchronous SRAM 100, all operations are referenced to a particular edge of an external clock signal CLK, typically the rising edge, as known in the art. The synchronous SRAM 100 includes an address register 102 which latches an address received on an address bus 104 in response to the external clock signal CLK. An address decoder 106 receives the latched address from the address register 102 and outputs a decoded address to a memory-cell array 108 including a number of conventional SRAM memory cells (not shown in FIG. 5) arranged in rows and columns. The latched address stored in the address register 102 is also output to a burst counter circuit 110 receiving the external clock signal CLK and a mode signal $\overline{MODE}$. In response to the external clock signal CLK, the burst counter circuit 110 develops sequential addresses beginning with the memory address latched by the address register 102, and outputs the sequential addresses to the address decoder 106. The mode signal $\overline{MODE}$ determines whether the sequence of memory addresses developed by the burst counter circuit 110 is a linear burst sequence or an interleaved burst sequence.

Sense amplifiers 112 are coupled to respective columns of the memory-cell array 108 and operate to sense the data stored in addressed memory cells in the memory-cell array 108. The sense amplifiers 112 output the sensed data through an output buffer circuit 114 and onto a data bus 116. An input register 118 latches data placed on the data bus 116 in response to the external clock signal CLK. The data latched in the input register 118 is output to the write driver circuits 50, which are, in turn, coupled to the memory-cell array 108 and operate as previously described to write data to addressed memory cells in the memory-cell array 108. Typically, there is one write driver circuit 50 for each line on the data bus 116. For example, if the data bus 116 is eight bits wide there are eight write driver circuits 50.

The synchronous SRAM 100 further includes a control circuit 120 that controls operation of the various components of the synchronous SRAM 100 during data transfer operations and during testing of the synchronous SRAM. The control circuit 120 receives the external clock signal CLK, an output enable signal $\overline{OE}$, a chip enable signal $\overline{CE}$, and a write enable signal $\overline{WE}$, and generates a number of internal control signals to control the various components of the synchronous SRAM 100 in response to these signals. In addition, the control circuit 120 develops the enable signal $\overline{EN}$ and the test mode signals WRITETM and $\overline{WRITETM}$ to control the write driver circuits 50 and other components of the synchronous SRAM 100 during the test mode of operation. The control circuit 120 may also be coupled to the write driver circuits 50 through a test data bus 122 on which test data is applied during the test mode of operation.

During a read data transfer operation, an external circuit (not shown in FIG. 7) places an address on the address bus 104, activates the output enable signal $\overline{OE}$ and the chip enable signal $\overline{CE}$, and deactivates the write enable signal $\overline{WE}$. The address on the address bus 104 is latched by the address register 102 on the next rising edge of the external clock signal CLK. In response to the high write enable signal $\overline{\text{WE}}$, the control circuit 120 disables the input register circuit 118 and places the output buffer circuit 114 in a low impedance state coupling the data bus 116 to the sense amplifiers 112. Typically, on the next subsequent rising edge of the external clock signal CLK, the latched address stored in the address register 102 is output to the address decoder 106, which decodes the memory address and activates the addressed memory cells in the memory-cell array 108. The sense amplifiers 112 thereafter sense the data stored in the addressed memory cells and outputs the data to the output buffer circuit 114 which, in turn, places the data on the data bus 116 where it is available to be read by the external circuit.

During a write data transfer operation, the external circuit places an address on the address bus 104, data on the data bus 116, deactivates the output enable signal $\overline{\text{OE}}$, and activates the chip enable signal $\overline{\text{CE}}$ and write enable signal $\overline{\text{WE}}$. In response to the active write enable signal $\overline{\text{WE}}$ and inactive output enable signal $\overline{\text{OE}}$, the control circuit 120 places the output buffer circuit 114 in a high impedance state and enables the input register 118. On the next subsequent rising edge of the external clock signal CLK, the address register 102 latches the address placed on the address bus 104, and the input register 118 latches the data placed on the data bus 116. Typically on the next subsequent rising edge of the external clock signal CLK, the latched address is output to the address decoder 106 which decodes the address and activates the addressed memory cells in the memory-cell array 108, and the latched data stored in the input register 118 is output to the write driver circuits 50. The write driver circuits 50 operate as previously described to write the data to the addressed memory cells in the memory-cell array 108. During a write data operation, the control circuit 120 drives the test mode signals WRITEM and $\overline{\text{WRITEM}}$ low and high, respectively, placing the write driver circuit 50 in the normal write mode as previously described.

During the test mode of operation, the control circuit 120 controls the operation of the components in the synchronous SRAM 100 to test the SRAM memory cells in the memory-cell array 108. The synchronous SRAM 100 may be placed in the test mode of operation in a variety of ways, such as by a particular sequence of activating the control signals $\overline{\text{OE}}$, $\overline{\text{CE}}$, $\overline{\text{WE}}$, or by applying a super voltage on one of the pins of the synchronous SRAM 100, as known in the art. In addition, the control circuit 120 may itself develop the test data to be written to the memory cells and supply this test data over the test data bus 122 coupled to the write driver circuits 50. Alternatively, the test data may be placed on the data bus 116 and coupled through the input register 118 to the write driver circuits 50 as previously described during normal write data transfer operations. In either case, the control circuit 120 drives the signals $\overline{\text{WRITETM}}$ and WRITETM low and high, respectively, placing the write driver circuits 50 in the test write mode and controls the enable signal $\overline{\text{EN}}$ as previously described in response to the external clock signal CLK to write test data to the memory cells in the memory-cell array 108. After the test data has been written to the memory cells in the memory-cell array 108, the data is read from the corresponding memory cells and compared to the data written. When the data read from a particular memory cell does not equal the data written to that memory cell the memory cell is defective and an error is flagged. One skilled in the art will appreciate that the reading of the test data written to the memory cells in the memory-cell array 108 may be performed either by the control circuit 120 or by an external circuit.

Figure 7:
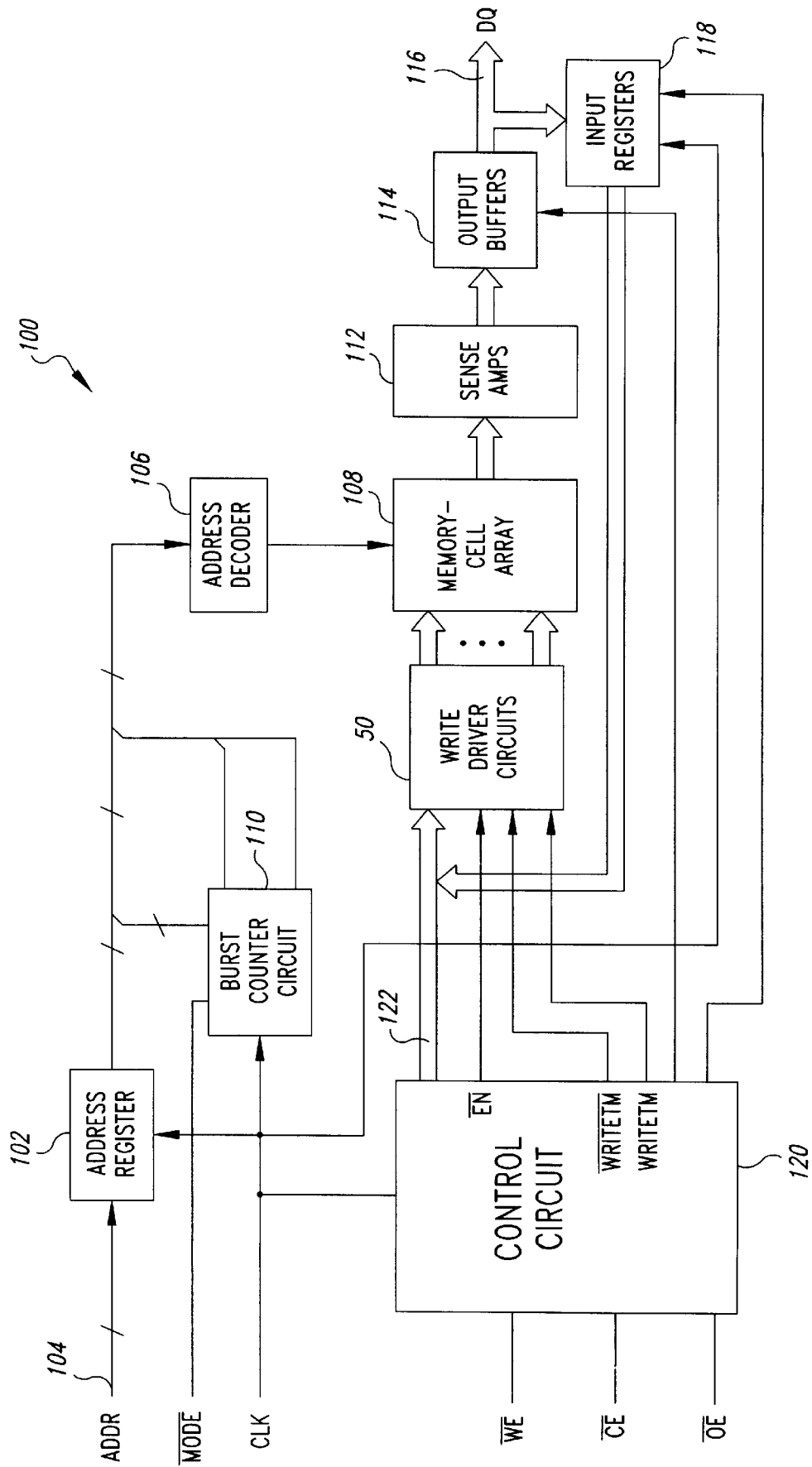
FIG. 7 is a functional block diagram of a synchronous SRAM including the write driver circuit of FIG. 3.
Figure 8:
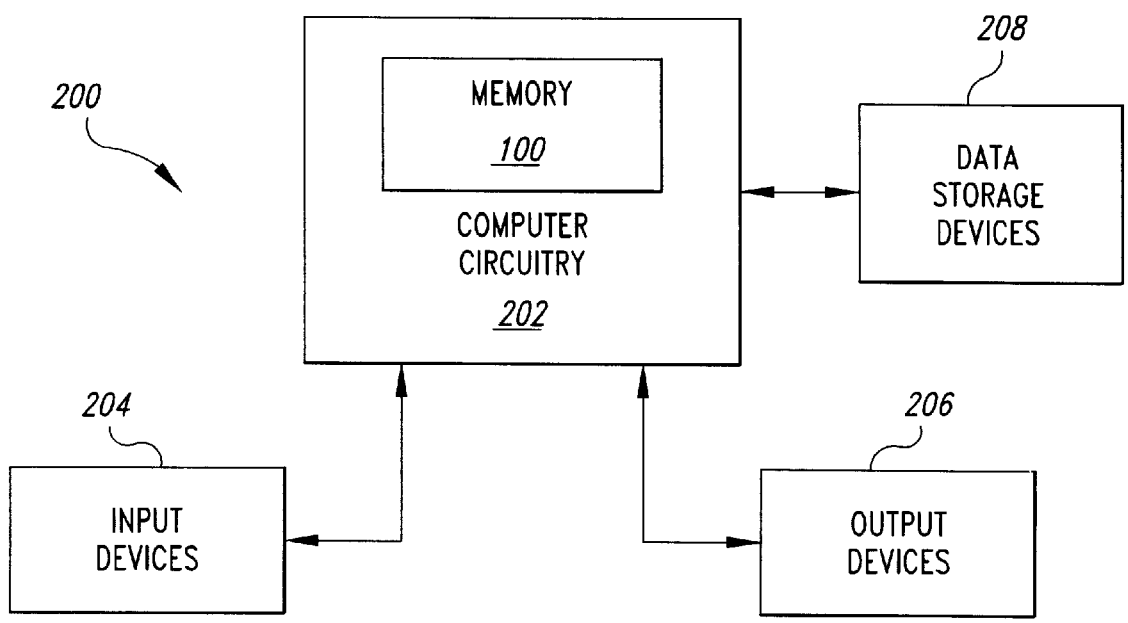
FIG. 8 is a functional block diagram of a computer system including the synchronous SRAM of FIG. 7.

FIG. 8 is a block diagram of a computer system 200 including the synchronous SRAM 100 of FIG. 7. The computer system 200 includes computer circuitry 202 for performing various computing functions, such as executing specific software to perform specific calculations or tasks. In addition, the computer system 200 includes one or more input devices 204, such as a keyboard or a mouse, coupled to the computer circuitry 202 to allow an operator to interface with the computer system 200. Typically, the computer system 200 also includes one or more output devices 206 coupled to the computer circuitry 202, such output devices typically being a printer or a video terminal. One or more data storage devices 208 are also typically coupled to the computer circuitry 202 to store data or retrieve data from external storage media (not shown). Examples of typical data storage devices 208 include hard and floppy disks, tape cassettes, and compact disk read-only memories (CD-ROMs). The computer circuitry 202 is typically coupled to the synchronous SRAM 100 through a control bus, a data bus, and an address bus to provide for writing data to and reading data from the synchronous SRAM.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A write driver circuit, comprising:
   a drive circuit having a first drive node adapted to receive a first voltage, a second drive node, an input adapted to receive a data signal, and an output, the drive circuit coupling the output to the first drive node when the data signal has a first logic voltage, and coupling the output to the second drive node when the data signal has a second logic voltage; and
   a test circuit having an input adapted to receive a test mode signal, and an output coupled to the second drive node, the test circuit developing a first impedance between the second drive node and a second voltage source when the test mode signal is active, and developing a second impedance between the second drive node and the second voltage source when the test mode signal is inactive, the first impedance causing a test voltage to be developed on the output and the test voltage having a value between the first and second logic voltages.

2. The write driver circuit of claim 1 wherein the first impedance is greater than the second impedance.

3. The write driver circuit of claim 1 wherein the test circuit includes a transistor coupled between the second drive node and the second voltage source.

4. The write driver circuit of claim 1 wherein the first voltage source equals a supply voltage $V_{CC}$.

5. The write driver circuit of claim 1, further including a control circuit adapted to receive a clock signal and coupled to the drive circuit, the control circuit developing the data signal having a constant write pulse width time responsive to the clock signal.

6. The write driver circuit of claim 1 wherein the drive circuit includes a PMOS transistor and an NMOS transistor coupled in series between the first and second drive nodes, each transistor having its gate coupled to the input of the drive circuit and having its drain coupled to the output of the drive circuit.

7. The write driver circuit of claim 1 wherein the test circuit comprises:
   a first transistor having signal terminals coupled between the second drive node and the second voltage source, and a control terminal;
   a NOR gate having an output coupled to the input of the drive circuit, and having one input adapted to receive an enable signal and a second input adapted to receive a write data signal;
   a voltage reference circuit including a PMOS transistor coupled as a load between a supply voltage source and an output node, and an NMOS transistor coupled between the output node and a reference voltage source and having its gate coupled to the output of the NOR gate, the voltage reference circuit developing a reference voltage on the output node responsive to the output of the NOR gate;
   a transmission gate having first and second signal terminals coupled between the output node and the gate of the first transistor, and having a control terminal adapted to receive the test mode signal, the transmission gate coupling the first signal terminal to the second signal terminal responsive to the test mode signal; and
   a second transistor having signal terminals coupled between gate of the first transistor and the supply voltage source, and having a control terminal adapted to receive the test mode signal, the second transistor coupling the gate of the first transistor to the supply voltage source when the test mode signal is inactive.

8. A write driver circuit, comprising:
   a drive circuit having first and second drive nodes, an input adapted to receive a data signal, and an output, the drive circuit coupling the output to the first drive node when the data signal has a first logic voltage, and coupling the output to the second drive node when the data signal has a second logic voltage;
   a first test circuit having an input adapted to receive a test mode signal, and an output coupled to the first drive node, the first test circuit developing a first impedance between the first drive node and a first voltage source when the test mode signal is active, and developing a second impedance between the first drive node and the first voltage source when the test mode signal is inactive, the first impedance causing a first test voltage to be developed on the output and the first test voltage having a value between the first and second logic voltages; and
   a second test circuit having an input adapted to receive the test mode signal, and an output coupled to the second drive node, the second test circuit developing a first impedance between the second drive node and a second voltage source when the test mode signal is active, and developing a second impedance between the second drive node and the second voltage source when the test mode signal is inactive, the first impedance causing a second test voltage to be developed on the output and the second test voltage having a value between the first and second logic voltages.

9. The write driver circuit of claim 8 wherein the first impedance is greater than the second impedance.

10. The write driver circuit of claim 8 wherein the first test circuit includes a transistor coupled between the first drive node and the first voltage source and the second test circuit includes a transistor coupled between the second drive node and the second voltage source.

11. The write driver circuit of claim 8 wherein the first voltage source supplies a voltage of approximately zero volts and the second voltage source supplies a supply voltage $V_{CC}$.

12. The write driver circuit of claim 8, further including a control circuit adapted to receive a clock signal and coupled to the drive circuit, the control circuit developing the data signal having a constant write pulse width time responsive to the clock signal.

13. The write driver circuit of claim 8 wherein the drive circuit includes a PMOS transistor and an NMOS transistor coupled in series between the first and second drive nodes, each transistor having its gate coupled to the input of the drive circuit and having its drain coupled to the output of the drive circuit.

14. The write driver circuit of claim 8 wherein each test circuit comprises:
   a first transistor having signal terminals coupled between the associated drive node and the associated voltage source, and a control terminal;
   a NOR gate having an output coupled to the input of the drive circuit, and having one input adapted to receive an enable signal and a second input adapted to receive a write data signal;
   a voltage reference circuit including a PMOS transistor coupled as a load between a supply voltage source and an output node, and an NMOS transistor coupled between the output node and a reference voltage source and having its gate coupled to the output of the NOR gate, the voltage reference circuit developing a reference voltage on the output node responsive to the output of the NOR gate;
   a transmission gate having first and second signal terminals coupled between the output node and the gate of the first transistor, and having a control terminal adapted to receive the test mode signal, the transmission gate coupling the first signal terminal to the second signal terminal responsive to the test mode signal; and
   a second transistor having signal terminals coupled between gate of the first transistor and the supply voltage source, and having a control terminal adapted to receive the test mode signal, the second transistor coupling the gate of the first transistor to the supply voltage source when the test mode signal is inactive.

15. A write driver circuit, comprising:
   a drive circuit having a reference node, a first voltage node adapted to receive a first voltage, an input adapted to receive a data signal, and an output, the drive circuit coupling the output to the first voltage node when the data signal has a first logic voltage, and coupling the output to the reference node when the data signal has a second logic voltage;
   an adjustable impedance element coupled between the reference node and a reference voltage node, the adjustable impedance element having a control input adapted to receive a control signal, the adjustable impedance element having an impedance that varies as a function of the control signal; and
   a test voltage circuit having an input adapted to receive a test mode signal, and an output coupled to the control input of the impedance element, the test voltage circuit developing a control signal having a first magnitude when the test mode signal is active, and developing a control signal having a second magnitude when the test mode signal is inactive, the first magnitude causing the impedance element to develop an impedance having a value that causes a test voltage to be developed on the output of the drive circuit, and the test voltage having a value between the first and second logic voltages.

16. The write driver circuit of claim 15, further including a control circuit adapted to receive a clock signal and coupled to the drive circuit, the control circuit developing the data signal having a constant write pulse width time responsive to the clock signal.

17. The write driver circuit of claim 15 wherein the drive circuit includes a PMOS transistor and an NMOS transistor coupled respectively between the supply first voltage node and the reference node, each transistor having its gate coupled to the input of the drive circuit and having its drain coupled to the output of the drive circuit.

18. The write driver circuit of claim 15 wherein the test voltage circuit includes:
- a first transistor having signal terminals coupled between the reference node and a reference voltage source, and a control terminal;
- a voltage reference circuit including a PMOS transistor coupled as a load between a supply voltage source and an output node, and an NMOS transistor coupled between the output node and the reference voltage source and having its gate coupled to the input of the drive circuit, the voltage reference circuit developing a reference voltage on the output node responsive to the data signal on the input of the drive circuit;
- a transmission gate having first and second signal terminals coupled between the output node and the gate of the first transistor, and having a control terminal adapted to receive the test mode signal, the transmission gate coupling the first signal terminal to the second signal terminal responsive to the test mode signal;
- a second transistor having signal terminals coupled between gate of the first transistor and the supply voltage source, and having a control terminal adapted to receive the test mode signal, the second transistor coupling the gate of the first transistor to the supply voltage source when the test mode signal is inactive; and
- a NOR gate having an output coupled to the input of the drive circuit, and having one input adapted to receive an enable signal and a second input adapted to receive a write data signal.

19. A write driver circuit, comprising:
- a first drive circuit having a first reference node, a first voltage node adapted to receive a first voltage, an input adapted to receive a data signal, and an output, the first drive circuit coupling the output to the first voltage node when the data signal has a first logic voltage, and coupling the output to the first reference node when the data signal has a second logic voltage;
- a first adjustable impedance element coupled between the first reference node and a first reference voltage node, the first adjustable impedance element having a control input adapted to receive a first control signal, the first adjustable impedance element having an impedance that varies as a function of the magnitude of the first control signal;
- a first test voltage circuit having an input adapted to receive a test mode signal, and an output coupled to the control input of the first impedance element, the first test voltage circuit developing a control signal having a first magnitude when the test mode signal is active, and developing a control signal having a second magnitude when the test mode signal is inactive, the first magnitude causing the first adjustable impedance element to develop an impedance having a value that causes a first test voltage to be developed on the output of the first drive circuit, and the test voltage having a value between the first and second logic voltages;
- a second drive circuit having a second reference node, a first voltage node adapted to receive the first voltage, an input adapted to receive a complementary data signal, and an output, the second drive circuit coupling the output to the first voltage node when the complementary data signal has the first logic voltage, and coupling the output to the second reference node when the complementary data signal has the second logic voltage;
- a second adjustable impedance element coupled between the second reference node and a second reference voltage node, the second adjustable impedance element having a control input adapted to receive a second control signal, the second adjustable impedance element having an impedance that varies as a function of the magnitude of the second control signal; and
- a second test voltage circuit having an input adapted to receive the test mode signal, and an output coupled to the control input of the second impedance element, the test voltage circuit developing a second control signal having a third magnitude when the test mode signal is active, and developing a second control signal having a fourth magnitude when the test mode signal is inactive, the third magnitude causing the second adjustable impedance element to develop an impedance having a value that causes a second test voltage to be developed on the output of the second drive circuit, and the test voltage having a value between the first and second logic voltages.

20. The write driver circuit of claim 19 wherein each of the first and second test voltage circuits comprises:
- a voltage reference circuit including a PMOS transistor coupled as a load between a supply voltage source and the control input of the respective adjustable impedance element, and an NMOS transistor coupled between the control input of the respective adjustable impedance element and the reference voltage source and having its gate coupled to the input of the drive circuit, the voltage reference circuit developing the control signal on the output node responsive to the data signal on the input of the drive circuit;
- a transmission gate having first and second signal terminals coupled between the output node and the gate of the first transistor, and having a control terminal adapted to receive the test mode signal, the transmission gate coupling the first signal terminal to the second signal terminal responsive to the test mode signal;
- a second transistor having signal terminals coupled between gate of the first transistor and the supply voltage source, and having a control terminal adapted to receive the test mode signal, the second transistor coupling the gate of the first transistor to the supply voltage source when the test mode signal is inactive; and
- a NOR gate having an output coupled to the input of the drive circuit, and having one input adapted to receive an enable signal and a second input adapted to receive a write data signal.

21. The write driver circuit of claim 19, further comprising:
- a first NOR gate having two inputs and an output coupled to the input of the first drive circuit;
- a second NOR gate having two inputs and an output coupled to the input of the second drive circuit; and
- a control circuit coupled to the inputs of the first and second NOR gates and adapted to receive a clock signal, the control circuit developing a first data signal on one input of the first NOR gate and a complementary data signal on one input of the second NOR gate, and developing an enable signal on each of the other inputs of the NOR gates, the control circuit driving the enable signal active responsive to the clock signal for a write pulse width time.

22. The write driver circuit of claim 19 wherein the outputs of the first and second drive circuits are coupled to respective complementary digit lines associated with a column of memory cells in a memory-cell array.

23. A write driver circuit, comprising:
   a drive circuit having first and second reference nodes, an input adapted to receive a data signal, and an output, the drive circuit coupling the output to the first reference node when the data signal has a first logic voltage, and coupling the output to the second reference node when the data signal has a second logic voltage;
   a first adjustable impedance element coupled between the first reference node and a first reference voltage node, the first adjustable impedance element having a control input adapted to receive a first control signal, the first adjustable impedance element having an impedance that varies as a function of the magnitude of the first control signal;
   a first test voltage circuit having an input adapted to receive a test mode signal, and an output coupled to the control input of the first adjustable impedance element, the first test voltage circuit developing a control signal having a first magnitude when the test mode signal is active, and developing a control signal having a second magnitude when the test mode signal is inactive, the first magnitude causing the first adjustable impedance element to develop an impedance having a value that causes a first test voltage to be developed on the output of the drive circuit and the test voltage having a value between the first and second logic voltages; and
   a second adjustable impedance element coupled between the second reference node and a second reference voltage node, the second adjustable impedance element having a control input adapted to receive a second control signal, the second adjustable impedance element having an impedance that varies as a function of the magnitude of the second control signal;
   a second test voltage circuit having an input adapted to receive the test mode signal, and an output coupled to the control input of the second adjustable impedance element, the second test voltage circuit developing a second control signal having a third magnitude when the test mode signal is active, and developing a second control signal having a fourth magnitude when the test mode signal is inactive, the third magnitude causing the second adjustable impedance element to develop an impedance having a value that causes a second test voltage to be developed on the output of the drive circuit, and the test voltage having a value between the first and second logic voltages.

24. The write driver circuit of claim 23 wherein the drive circuit includes a PMOS transistor and an NMOS transistor coupled respectively between the first and second reference terminals, and each transistor having its gate coupled to the input of the drive circuit.

25. A synchronous static random access memory, comprising:
   an address bus;
   a control bus;
   a data bus;
   an address decoder coupled to the address bus;
   a read/write circuit coupled to the data bus;
   a memory-cell array coupled to the address decoder, control circuit, and read/write circuit;
   an external clock terminal adapted to receive an external clock signal;
   a write driver circuit coupled to the memory-cell array, the write driver circuit including,
   a drive circuit having a first drive node adapted to receive a first voltage, a second drive node, an input adapted to receive a data signal, and an output, the drive circuit coupling the output to the first drive node when the data signal has a first logic voltage, and coupling the output to the second drive node when the data signal has a second logic voltage, and
   a test circuit having an input adapted to receive the test mode signal, and an output coupled to the second drive node, the test circuit developing a first impedance between the second drive node and a second voltage source when the test mode signal is active, and developing a second impedance between the second drive node and the second voltage source when the test mode signal is inactive, the first impedance casing a test voltage to be developed on the output and the test voltage having a value between the first and second logic voltages; and
   a control circuit coupled to the control bus, the external clock terminal, and the write driver circuits, the control circuit operable in a test mode responsive to the external clock signal and control signals on the control bus to activate the test mode signal, transfer test data to the memory cells, and sense test data from the memory cells to detect defective memory cells.

26. The synchronous static random access memory of claim 25 wherein each memory cell comprises:
   a pair of cross-coupled inverters;
   a first access transistor having signal terminals coupled between a digit line and the input of one of the inverters, and a control terminal coupled to an associated word line; and
   a second access transistor having signal terminals coupled between a complementary digit line and the output of the one of the inverters, and a control terminal coupled to the associated word line.

27. A computer system, comprising:
   a data input device;
   a data output device; and
   a processor coupled to the data input and output devices, the processor including a synchronous static random access memory that includes a write driver circuit having,
   a drive circuit having a first drive node adapted to receive a first voltage, a second drive node, an input adapted to receive a data signal, and an output, the drive circuit coupling the output to the first drive node when the data signal has a first logic voltage, and coupling the output to the second drive node when the data signal has a second logic voltage; and
   a test circuit having an input adapted to receive the test mode signal, and an output coupled to the second drive node, the test circuit developing a first impedance between the second drive node and a second voltage source when the test mode signal is active, and developing a second impedance between the second drive node and the second voltage source when the test mode signal is inactive, the first impedance causing a test voltage to be developed on the output and the test voltage having a value between the first and second logic voltages.

28. The computer system of claim 27 wherein the synchronous static random access memory includes a memory-cell array having a plurality of memory cells, each memory cell comprising:
 a pair of cross-coupled inverters;
 a first access transistor having signal terminals coupled between a digit line and the input of one of the inverters, and a control terminal coupled to an associated word line; and
 a second access transistor having signal terminals coupled between a complementary digit line and the output of the one of the inverters, and a control terminal coupled to the associated word line.

29. A method for testing memory cells in a static random access memory including a memory-cell array having a plurality of memory cells, each memory cell coupled to a pair of complementary digit lines, the method comprising the steps of:
 activating a memory cell;
 applying a first voltage corresponding to a first logic state on one of the associated complementary digit lines;
 applying a test voltage on the other associated complementary digit line, the test voltage having a value between the first voltage and a second voltage corresponding to the complement of the first logic state;
 sensing the voltages on the complementary digit lines; and
 detecting an error in the memory cell when the voltages on the one and the other complementary digit lines are not approximately at the first and second voltages, respectively.

30. The method of claim 29 wherein the first voltage is approximately equal to a supply voltage, and the second voltage is approximately equal to a reference voltage.

31. The method of claim 29 wherein the steps of applying the first voltage and applying the test voltage each include the steps of applying the first and test voltages, respectively, for a fixed time.

32. A method for testing memory cells in a static random access memory including a memory-cell array having a plurality of memory cells, each memory cell coupled to a pair of complementary digit lines, the method comprising the steps of:
 activating a memory cell;
 applying for a fixed time a first voltage corresponding to a first high logic state on one of the associated complementary digit lines;
 applying a test voltage for the fixed time on the other associated complementary digit line, the test voltage having a value between the first voltage and a second voltage corresponding to a low logic state;
 sensing the voltages on the complementary digit lines; and
 detecting an error in the memory cell when the voltages on the one and the other complementary digit lines are not at approximately the first and second voltages, respectively.

33. The method of claim 32, further including the steps of:
 deactivating the memory cell;
 activating the memory cell;
 applying for the fixed time the test voltage and the first voltage on the one and the other complementary digit lines, respectively;
 sensing the voltages on the complementary digit lines;
 detecting an error in the memory cell when the voltages on the one and the other complementary digit lines are not at approximately the second and first voltages, respectively; and
 determining the memory cell is defective when either of the steps of detecting detects an error.

34. The method of claim 33 wherein the first voltage is approximately equal to a supply voltage, and the second voltage is approximately equal to a reference voltage.

35. A method of generating a write data signal on an output node responsive to a data input signal and a test mode signal, comprising:
 coupling the output node to a first voltage responsive to a data input signal having a first logic level;
 coupling the output node through a first impedance to a second voltage responsive to a data input signal having a second logic level and an inactive test mode signal; and
 coupling the output node through a second impedance to the second voltage responsive to a data input signal having the second logic and an active test mode signal, the second impedance causing a test voltage to be developed on the output node and the test voltage having a value between the first and second voltages.

36. The method of claim 35 wherein the second impedance is greater than the first impedance.

37. The method of claim 35 wherein the first voltage approximately equals a supply voltage $V_{CC}$ and the second voltage approximately equals a reference voltage of zero volts.

38. The method of claim 35 wherein each of the steps of coupling occurs for a predetermined time responsive to a clock signal.

39. A method of generating a write data signal on an output node responsive to a data input signal and a test mode signal, comprising:
 coupling the output node through a first impedance to a first voltage responsive to a data input signal having a first logic level and an inactive test mode signal;
 coupling the output node through a second impedance to the first voltage responsive to a data input signal having the first logic level and an active test mode signal, the second impedance causing a first test voltage to be developed on the output node and the first test voltage having a value between the first voltage and a second voltages;
 coupling the output node through the first impedance to the second voltage responsive to a data input signal having a second logic level and an inactive test mode signal; and
 coupling the output node through the second impedance to the second voltage responsive to a data input signal having the second logic level and an active test mode signal, the second impedance causing a second test voltage to be developed on the output node and the second test voltage having a value between the first and second voltages.

40. The method of claim 39 wherein the second impedance is greater than the first impedance.

41. The method of claim 39 wherein the first voltage approximately equals a supply voltage $V_{CC}$ and the second voltage approximately equals a reference voltage of zero volts.

42. The method of claim 39 wherein each of the steps of coupling occurs for a predetermined time responsive to a clock signal.

* * * * *

UNITED STATES PATENT AND TRADEMARK OFFICE
CERTIFICATE OF CORRECTION

PATENT NO. : 6,161,204
DATED : December 12, 2000
INVENTOR(S) : Dean Gans

It is certified that error appears in the above-identified patent and that said Letters Patent is hereby corrected as shown below:

Title page,
Item [57], ABSTRACT,
Line 13, "the, test" should read -- the test --

Column 10,
Line 39, "a test" should read -- a test --

Column 15,
Line 36, "circuit and" should read -- circuit, and --

Column 18,
Lines 46-47, "second voltages" should read -- second voltage --

Signed and Sealed this

Twenty-fourth Day of August, 2004

JON W. DUDAS
*Director of the United States Patent and Trademark Office*